United States Patent [19]

Kafafian

[11] 3,982,236

[45] Sept. 21, 1976

[54] COMMUNICATIONS AND CONTROL METHOD AND APPARATUS FOR PERSONS WHO MAY HAVE MUSCULAR INCOORDINATION AND/OR SPASTICITY

[76] Inventor: Haig Kafafian, 4201 Cathedral Ave. N.W., Washington, D.C. 20016

[22] Filed: Dec. 24, 1974

[21] Appl. No.: 536,176

[52] U.S. Cl. .................... 340/147 R; 340/147 MD; 340/365 S
[51] Int. Cl.² .................... H04Q 3/00; G06C 7/00
[58] Field of Search ......... 340/365 S, 166 R, 147 R, 340/147 MD; 197/19

[56] References Cited
UNITED STATES PATENTS

| | | | |
|---|---|---|---|
| 3,466,647 | 9/1969 | Guzak, Jr. | 178/17 R X |
| 3,612,765 | 10/1971 | Dawson | 178/17 R |
| 3,750,160 | 7/1973 | Elzinga | 340/365 S X |
| 3,781,802 | 12/1973 | Kafafian | 340/147 R |
| 3,792,466 | 2/1974 | Arnold et al. | 340/365 S X |
| 3,798,599 | 3/1974 | Kafafian | 340/166 R X |
| 3,818,448 | 6/1974 | Wilkins | 340/147 R |
| 3,831,147 | 8/1974 | Kafafian | 340/166 R |

*Primary Examiner*—Donald J. Yusko
*Attorney, Agent, or Firm*—Bacon & Thomas

[57] ABSTRACT

A system for use by persons who may have muscular incoordination and/or spasticity or the like is provided with means for controlling the disabling of a function producing means depending upon the person's motor capability. A disabling circuit is responsive to an actuation of any of a variety of input interface means whereby subsequent actuations of the input interface means prior to the expiration of a variable, predetermined disabling time interval produce no function.

3 Claims, 7 Drawing Figures

COMMUNICATIONS AND CONTROL METHOD AND APPARATUS FOR PERSONS WHO MAY HAVE MUSCULAR INCOORDINATION AND/OR SPASTICITY

CROSS REFERENCE

Reference is made to my earlier patents in the field of communications and control systems for persons who may be handicapped or severely disabled. U.S. Pat. No. 3,507,376, issued Apr. 21, 1970 for Communications System for the Handicapped; U.S. Pat. No. 3,781,802, issued Dec. 25, 1973, for Method of Communication and/or Testing of the Handicapped; U.S. Pat. No. 3,798,599, issued Mar. 19, 1974 for Single Input Controller for a Communication System; and U.S. Pat. No. 3,831,147, issued Aug. 20, 1974, for Communications System for the Handicapped. As specifically referred to below, these patents are hereby incorporated by reference.

BACKGROUND OF THE INVENTION

The above referred to patents focus their attention towards methods and apparatus for establishing a mode of communication and control among persons who may be disabled and others possessing cognitive abilities and comprehension through "CYBERCOM" (servicemark of Cyber Corp.) a unique family of man-machine communications and control systems. The above systems utilize a common dual-input code which permits the exchange of interfaces or keyboards, especially where matching and coupling of another style interface to the specific performance capabilities of each individual may be necessary. It has been demonstrated that it is often possible to employ "CYBERTYPE" and "WHISPER-TYPE" (servicemarks of Cyber Corp.) systems which permit use of a multiply handicapped individual's remaining motor capabilities. The three classes of interfaces specifically illustrated in the above patents are divided into categories which could broadly be termed 14-key unit, seven-key unit, and single-input interfaces.

The 14-key interface includes a remote keyboard electrically connected, for example, to an electric typewriter or other output device providing a printed output or the like or to an appliance such as a TV channel selector or other machine or display or device. In the case of a typewriter, each letter, symbol or function to be produced is assigned a pair of interface keys of the portable CYBERTYPE keyboard, one key being in each of two seven key banks. In this bilateral configuration of the dual-input interface, two keys are operated together using the finger, fist, or foot on each extremity or a prosthesis.

The seven-key unilateral interface includes only one bank of seven input keys or transducer means as described above, wherein one of the seven is actuated to provide, for example, the function of the right hand, fist, foot or prosthesis and then one of the same seven keys in the same bank is subsequently actuated to provide the equivalent of the left hand, fist, foot or prosthesis output.

A third class of interfaces in the CYBERCOM family of man-machine systems includes only one input transducer, whereby appropriate multiple actuations of the single transducer following the dual-input coding will yield the very same output achieved from each of the above two systems such as used in the WHISPER-TYPE in which case a microphone, among other types of input means may be used to provide the signal for the dual-input code for each letter or function on the controlled device or typewriter where a unique pair of input functions is assigned. This is what I call my "CYBER-CODE" as illustrated in the above mentioned patents.

While a code and typewriter, CRT, impact printer and other outputs have been specifically referred to, it will be appreciated that I use my system for a large variety of life support, communications and control systems required by persons who may be severely disabled.

This specific invention relates to a method and apparatus for enhancing the communication and control capability of a person who is handicapped or for other reasons may use a communications and/or control system with interfaces or keyboards which are connected to a man-machine system. The present state-of-the-art involving interfaces and man-machine communications and control systems for operating machines, for example, a typewriter, has been referred to above and in my previous patents. More particularly, the 14-key, seven-key and single input interfaces of the CYBERCOM family of man-machine systems, where a CYBERTYPE and/or WHISPER-TYPE is employed, have been discussed and are incorporated in the instant invention.

One specific purpose of this invention is to provide means for people who have severe tonic spasticity. This condition is exhibited by muscular incoordination and hence the erratic operation of interface units. In order to preclude the erratic operation of these interfaces, be they 14-key, seven-key, one key or an enlarged 49 key (conventional typewriter oriented) keyboards, the instant invention provides a means to assure proper control of the function producing means by a person having muscular incoordination such as exhibited in cerebral palsy.

For example, a person with tonic spasticity operating one of the four classes of interfaces of the bilateral, unilateral or single input variety previously noted, or a "push-button" telephone, a TV channel selector, a motor operated bed or other device can become impatient and frustrated because of uncontrolled actuating of the input interface. As a further example, a person operating a bilateral dual-input interface or keyboard might be able to properly actuate one of the left bank of keys with his left hand; however, if he is spastic with his right hand, which controls the right-hand bank of keys, he may obtain a plurality of actuations or strikes of the same letter or function if he does not release his left hand before his spastic right hand again actuates the key. On a unilateral dual-input interface or keyboard, if he strikes the same key twice, wherein the second strike is inadvertent or due to muscular incoordination or spasticity, an incorrect function or letter will be typed in the case where the interface controls a typewriter. In the case of a single input interface, the first actuation of the dual-input code operates a selection means and the second actuation of the dual-input operates a second selection means and a third actuation causes the function to be produced. A person with muscular incoordination could uncontrollably cause the undesired operation of the interface or transducer one or more times, thus causing the wrong letter to be typed or function produced on a device or appliance.

SUMMARY OF THE INVENTION

It is therefore an object of my invention to eliminate persons' frustrations caused by muscular incoordination when controlling devices and undesired operation of any device they may operate such as a typewriter, a machine or man-machine system. The incorporation of the features of this invention on any type of interface provides a disabling means whereby unwanted actuations will not cause the improper operation of the device being used. The disabling means includes a readily accessible timing control wherein the individual working with a person who is disabled or the person himself can adjust the duration of time whereby the remaining motor control capabilities and muscular incoordination characterizations of that individual are matched to the machine interface so that should an undesirable actuation of the interface take place, the machine or device will not operate. In my invention the first actuation of the interface initiates the operation of a delay circuit whose period is controlled and set by a variable timer control. Depending upon the user's motor control capabilities, the timer's setting can be varied and fixed to a position which precludes unwanted operation of the machine or device.

It is another object of the invention to permit persons who have limited control capabilities to operate the various classes of interfaces or keyboards. The invention opens the use of these interfaces and accompanying devices to a new segment of the population who are handicapped and who heretofore have been constrained or precluded from efficiently operating the devices thereby now permitting them to enhance their education, rehabilitation and be gainfully employed. The use of this invention will reduce the error rate and increase efficiency of persons who have muscular incoordination or who may be debilitated and are desirous of operating office equipment and other appliances, machines or devices. The reduced error rate and increased efficiency is extremely important in helping to reduce not only frustrations caused by the making of errors arising from the individual's incoordination, but this segment of disabled persons who have limited control will now have an opportunity to enter job training programs to which they heretofore were ineligible.

As mentioned, this invention and those set out in my prior patents are not limited to their use with typewriters or other print-out mechanisms, displays or other devices. For example, an electrically-controlled bed can now be properly operated by a patient who because of spasticity heretofore could not control the bed's motor which raises or lowers it to the precise position of comfort.

Another example is a person with muscular incoordination selecting a desired TV channel. If the person has tonic spasticity, the actuation of the interface in an undesired repetitive manner may occur and the correct channel is overshot or undershot. It is then necessary for the person to continue to attempt to reach the desired program, and often only does so by chance. This particular problem can be corrected, or at least greatly reduced, with the present invention. As can readily be discerned, once the selection is made, a further actuation of the interface will not advance the motor of the bed or move the TV's channel selector.

Handicapped persons with severe spasticity or muscular control or with conditions such as exhibited by persons having severe arthritis who are desirous of operating multiple keyboards such as standard typewriter keyboards or push-button telephones can also use the incorporation of the instant invention to great advantage and convenience to their well-being.

The previous examples, one for a communications system and the other for a control system, represent two broad applications of this invention which are critically needed for a large segment of the severely disabled population. These examples illustrate the value of the instant invention and open fertile fields of new uses of man-machines systems for persons who are disabled.

Incorporated with all classes of interface units is a differentiator connected to an output line from the various interface units which in turn provides a signal for a variable solid-state timing network. The timing interval can be varied from zero to 5 seconds so that the system can be used by persons depending upon their needs. If one does not regain a positioning control capability for a subsequent desired actuation for a period greater than 5 seconds, the user can still operate the equipment. The output from the timer is fed to a timing-interval indicator in the form of a light emitting diode (LED) which visually informs the user when the commencement of the next desired actuation can take place. Alternatively, an audio indicator may be used by blind or visually impaired persons; and for users who are deaf-blind, a palpable indicator is incorporated. The output from this timer is also directed to a solid-state switch which inhibits the flow of current in the event a subsequent actuation is made prior to the timer completing its preset period, thereby rendering the system impervious to further actuations.

Alternatively, in place of a solid-state switch, electromechanical means can be used to mechanically lock the keyboard, thereby physically restraining the user from actuating the interface. However, as will be appreciated from the following discussion, the solid-state switch is a preferred embodiment.

BRIEF DESCRIPTION OF THE DRAWINGS

The novel features and uniqueness of the invention are set forth in the appended claims. The invention itself, both as to construction and method of operation, together with additional objects, features and advantages thereof will be understood from the following description when read in conjunction with the accompanying drawings wherein:

14 KEY CYBERTYPE INTERFACE AND DELAY UNIT

Figure 1:
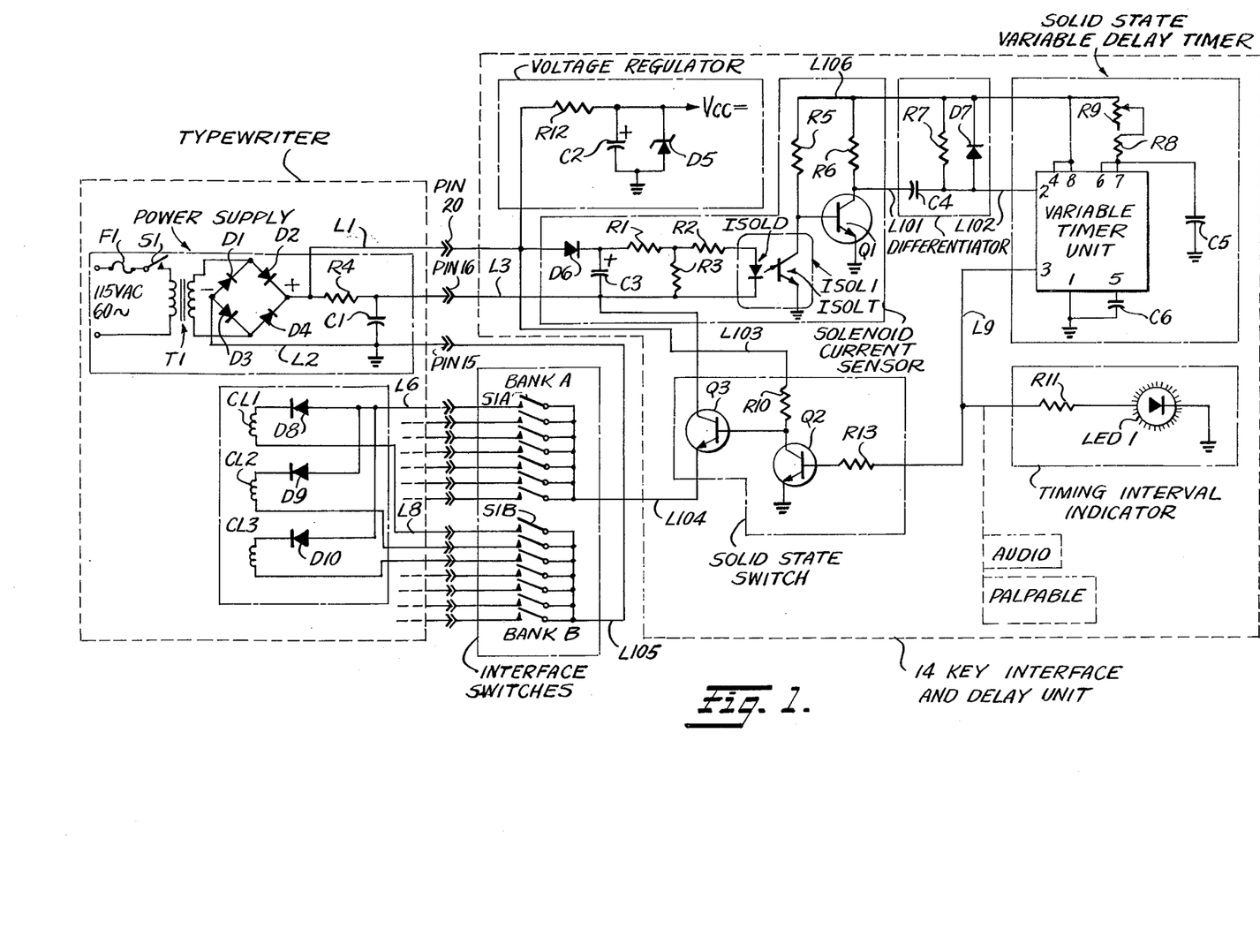
FIG. 1 is a schematic of the 14 key unit.

FIG. 1 is a detailed schematic of a delay circuit for use with a 14 key unit such as shown in my earlier U.S. Pat. Nos. 3,507,376 and 3,781,802 (herein incorporated by reference). A typewriter is illustrated including an undercarriage having a plurality of solenoids, CL1–CL3 being typical. A power supply unit includes a fuse F1 and a switch S1 in the input line of a 115 volt, 60 cycle AC source. The AC source is connected through a transformer T1 to a full-wave bridge rectifier circuit including a plurality of diodes D1–D4. The rectified source voltage is then connected to a resistance R4 and a capacitor C1 which is connected from the high side of the rectified voltage lines to power supply ground. Between the rectifier bridge and the resistance R4 a line L1 is connected to a point labeled PIN 20. The other outputs of the power supply L105 and L3 are connected through points PIN 15 and PIN 16, respectively. Hereinafter PIN 15 will also be designated as power supply ground. The reference to the PIN numbers will be appreciated particularly when taken in connection with a comparable 49 key conventional keyboard unit discussed below.

A solenoid operated electric typewriter is seen including the three representative solenoids CL1–CL3 and their respective selection diodes D8, D9, D10. The 14 input switches as seen in a matrix arrangement similar to that illustrated in my prior U.S. Pat. No. 3,507,376 are illustrated in two sets of banks labeled BANK A and BANK B which include respectively switches SW1A–SW7A and SW1B–SW7B. An Interface and Delay Unit between the Power Supply and the Interface Switches of BANK A and BANK B includes a Voltage Regulator Circuit, a Solenoid Current Sensor, a Differentiator, a Solid State Timer, a Solid State Switch and a Timing Interval Indicator. The Voltage Regulator includes line L-1 connected to PIN 20, together with resistor R12, capacitor C2 and zener diode D5. This circuit is a conventional shunt voltage regulator arrangement.

PINS 16 and 20 are also connected to a Solenoid Current Sensor circuit which includes a diode D6, a plurality of resistors R1, R2 and R3 and a capacitor C3. The power supply current is further connected through a light-coupled isolation switch unit ISOL1 which includes a light emitting diode ISOLD and a light actuated transistor ISOLT. The emitter of the transistor ISOLT is connected to power supply ground and the collector is connected to a source of regulated voltage through a resistor R5 via line L106. The collector of ISOLT is also connected to the base of transistor Q1. The collector of transistor Q1 is connected to the regulated voltage via line L106 and through a resistor R6. The conventional differentiator circuit consisting of a capacitor C4 and a resistor R7 is connected to the collector of Q1 in the Solenoid Current Sensor circuit. The input to the capacitor C4 of the differentiator circuit is connected through line L101. The other side of capacitor C4 is connected on line L102 to a resistor R7 and a diode D7. Line L102 is the input to a Solid State Timer circuit which includes a conventional variable timer unit. The timer circuit further includes in the usual manner a pair of capacitors C5 and C6, together with a pair of resistances R8 and R9. Resistance R9 is variable and can include a dial on the outside of the unit for varying the timing from 0 to 5 or even 10 seconds for purposes discussed both above and below.

The output of the timer circuit is connected via a line L9 to a Timing Interval Indicator including a resistance R11 and a light emitting diode LED1 for the purpose discussed below.

Line L9 also is connected through a resistance R13 to the base of a transistor Q2 having its collector connected to the base of a transistor Q3 in a Solid State Switch circuit. A resistance R10 which is also tied to the collector of Q2 is connected via a line L103 to PIN 20. The collector of transistor Q3 is connected via a line L3 to the PIN 16. The emitter of the transistor Q2 is connected to power supply ground while the emitter of transistor Q3 is connected via line L104 to the first bank, BANK A including switches SW1A–SW7A. PIN 15 is connected via line L105 to BANK B including switches SW1B–SW7B.

By way of a brief, general description of operation of the separate circuits described above, the Differentiator initiates the timing cycle of the Solid State Timer upon cessation of solenoid current flow at the completion of any CYBERTYPE "print" operation. The Solid State Timer in turn disables the Solid State Switch for the presetting timing interval. While so disabled, the Solid State Switch prevents current flow in any of the CYBERTYPE solenoids CL1–CL$n$. After the preset timing interval has been completed, the Solid State Switch is reenabled and CYBERTYPE solenoid current flow will again be under control of the 14 key interface switches.

Specifically, the AC power is applied to the input of the power supply transformer T1, and at this time no interface switch is closed. The CYBERTYPE Power Supply and the Delay circuit will reach their static states within a few cycles of the input power frequency. In the static state capacitor C1 is charged to the peak output voltage of the CYBERTYPE power supply bridge rectifier and there is thus no current through resistor R4. The Voltage Regulator consisting of resistor R12, capacitor C2 and zener diode D5 provides a source of regulated DC voltage to the Solenoid Current Sensor, Differentiator and Solid State Timer. With no current flow through resistor R4, no difference of potential exists between lines L1 and L3, thus no current flows into the current detector. With no current flow into the current detector, there is no current flow in the diode ISOLD. Thus, the transistor ISOLT passes no current, and transistor Q1 is biased to saturation via resistor R5 resulting in an input to the Differentiator line L101 of approximately 0 volts. The output of the Differentiator on line L102, which is the input to the Solid State Timer, is held at the regulated DC voltage by resistor R7. With its input held high, the output of the Solid State Timer via line L9 is approximately 0 volts. With the output of the Solid State Timer low, no current flows into the Timing Interval Indicator light emitting diode LED 1 and its series connected current limiting resistor R11. Thus, there is no light emission from the indicator. With the output from the Solid State Timer low, no current flows into the base of the input transistor Q2 of the Solid State Switch and its current limiting resistor R13. This enables saturation base current to flow to the base of the output transistor Q3 of the Solid State Switch from the DC power supply via lines L1 and L103 and current limiting resistor R10. Of course, base current cannot flow into transistor Q3 until such time as its emitter circuit is connected to the power supply return line L2 via line L104, a closed switch from BANK A, a closed switch from BANK B, the appropriate selection diode and solenoid and line L105 to PIN 15.

The simultaneous actuation of one switch from BANK A and one switch from BANK B of the 14 key interface will result in current flow through a predetermined single solenoid CL1–CL$n$ of the CYBERTYPE typewriter. To facilitate further description of the operation of the 14 Key Interface Delay circuit, one can assume that switches SW1A and SW1B are both held actuated. In this event, the power supply and the 14 key interface delay circuit assume a quasi-static state. In this state the emitter circuit of the output transistor Q3 of the Solid State Switch will be connected to the CYBERTYPE power supply return line L2, through line L104, switch SW1A, line L6, selection diode D8, solenoid CL1, line L8, switch SW1B and line L105.

With the emitter circuit closed, transistor Q3 receives base current through resistor R10 and is thus able to pass solenoid current through the selected CYBERTYPE solenoid CL1 from the power supply via line L3. The low resistance of any selected solenoid relative to resistor R4 results in a depletion of the static state charge on capacitor C1. Thus, current flows through resistor R4 for as long as a pair of interface switches are held closed. Current flow through resistor R4 produces a difference of potential between lines L1 and L3, the input to the solenoid current sensor. This difference of potential results in current flow through diode D6, thus charging capacitor C3. This charge is sufficient to provide "on state" current to the diode ISOLD. Resistor network R1–R3 limits the current to the diode ISOLD to a safe operating level. With on state current flowing in the diode ISOLD, its companion transistor ISOLT clamps the base of transistor Q1 to power supply ground. Current flow through transistor Q1 ceases, and the input to the differentiator rises sharply to the regulated supply voltage. Clamping diode 7 of the Differentiator network prevents the output of the Differentiator from rising above the regulated DC voltage in order to protect the input circuitry of the Solid State Timer. Since the Solid State Timer only responds to negative going input signals, there will be no change in its output and thus no change in the state of the Timing Interval Indicator including LED1 or the Solid State Switch.

Upon release of either the switch of BANK A or the switch of BANK B of the 14 key interface, the power supply and the 14 key delay circuit will each return to their previously described static states. The process through which this is achieved is as follows: The release of either switch SW1A or switch SW1B (in the example being discussed) breaks the circuit between the power supply and the selected solenoid. With the solenoid circuit broken, the voltage on capacitor C1 quickly returns to its static state level of the peak output of the power supply bridge rectifier D1–D4, thus causing current flow through resistor R4 to cease. With no current flow through resistor R4, no difference of potential exists between lines L1 and L3, the input to the Solenoid Current Sensor. With this input removed, capacitor C3 quickly discharges through the resistor network R1–R3 and the diode ISOLD. With the capacitor C3 discharged beyond the point required to provide the on state current to the diode ISOLD, its companion transistor ISOLT ceases to conduct. This removes the base clamp from transistor Q1 which again conducts heavily resulting in a drop in the output voltage of the solenoid current sensor at line L101 from that of the regulated DC voltage to approximately 0 volts. The Differentiator changes the negative level shift at the output of the Solenoid Current Sensor to a negative going voltage spike at the input line L102 to the Solid State Timer. The negative going input to the Solid State Timer initiates its timing cycle, the duration of which is determined by the RC network consisting of resistors R8, R9 and capacitor C5. Variable resistor R9 allows the period of the timing cycle to be preset over a broad range. During the timing cycle the output of the solid state timer at line L9 remains at approximately the regulated DC voltage level. This high voltage output results in current flow through current limiting resistor R11 and light emitting diode LED1, thus illuminating the Timing Interval Indicator. The high voltage output also results in current limiting resistor R13, thus clamping the base of transistor Q3 to power supply ground, preventing the flow of base current to Q3 and disabling the Solid State Switch. Hence, the possiblity of the solenoid current flow during the timing interval of the Solid State Timer is precluded. At the end of its timing interval the output of the Solid State Switch will return to approximately 0 volts. The Timing Interval Indicator will be extinguished, and the Solid State Switch will be enabled. Both the power supply and the 14 Key Interface Delay circuit will be in their static states again prepared for an ensuing solenoid selection and switch operation as before.

SEVEN KEY INPUT CYBERTYPE INTERFACE AND DELAY UNIT

Figure 2:
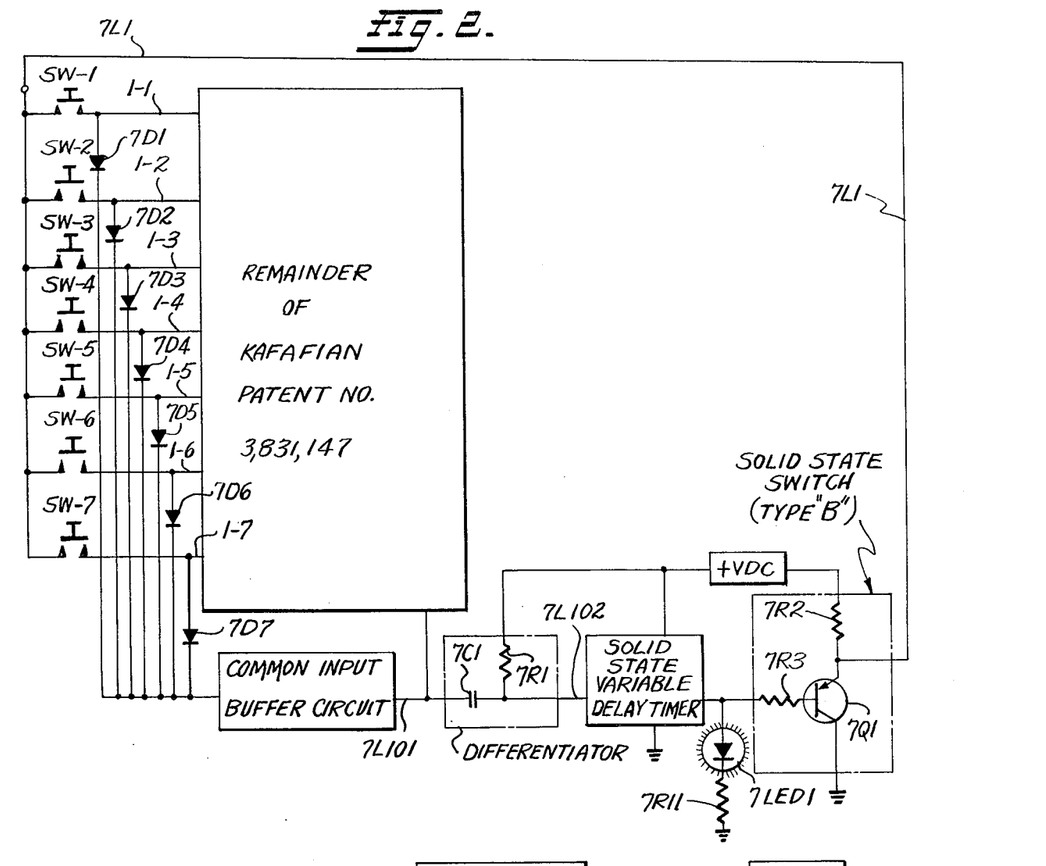
FIG. 2 is a schematic of the seven key embodiment.
Figure 3:
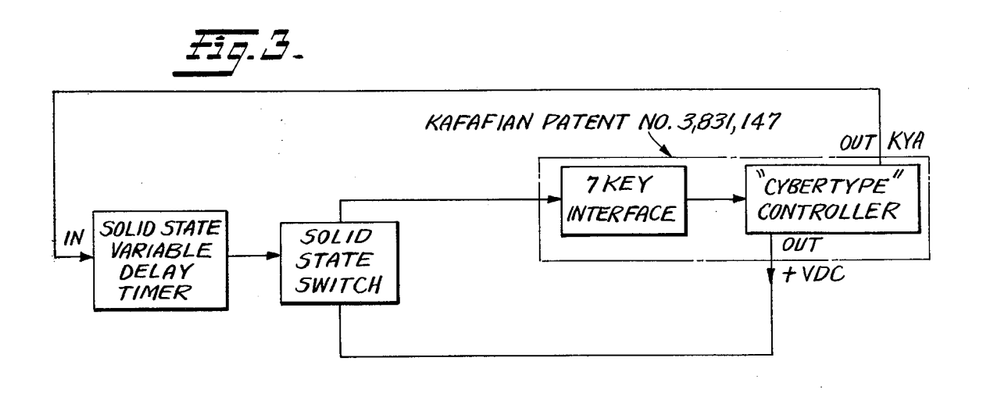
FIGS. 3 and 4 are block diagrams of the seven key unit wherein the switch is solid state and electromechanical respectively.
Figure 4:
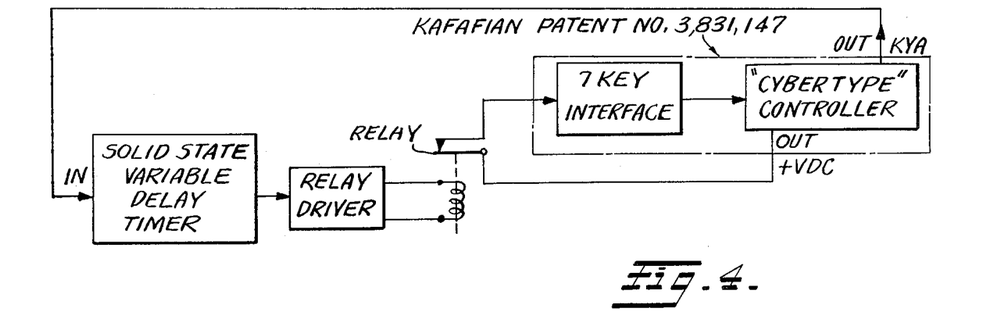

Referring now to FIG. 2, an interface unit similar to that illustrated in FIG. 1 is shown for use in conjunction with a seven key controller unit as disclosed in my prior U.S. Pat. No. 3,831,147 (incorporated herein by reference). This combination using a Solid State Switch is also illustrated in block diagram form in FIG. 3, while a relay equivalent modification is illustrated in FIG. 4.

A plurality of interface coding switch means or transducers SW1–SW7 are shown connected to input buffer circuits as discussed in U.S. Pat. No. 3,831,147. Energization of any of the switches SW1-SW7 also connects the potential to a common input buffer over a plurality of lines including a plurality of respective diodes 7D1–7D7. Reference is made to the above mentioned patent for the complete circuit and operation thereof.

The common input buffer circuit, as well as being connected to the remainder of the controller circuit is connected to a differentiator circuit including capacitor 7C1 and a resistor 7R1. The Differentiator circuit is connected to a Solid State Timer which in turn is connected to a Timing Interval Indicator including the LED1 and resistor R11. The output of the Solid State Timer is connected to a Solid State Switch including a plurality of resistors 7R2, 7R3 and a switching transistor 7Q1. The collector of the transistor is connected to the +VDC level via resistor 7R2; its emitter is connected to power supply common. The base of the transistor is connected to the output of Solid State Timer via resistor 7R3. The Solid State Timer circuitry is the same as that illustrated in FIG. 1.

In operation, the Differentiator initiates the timing cycle of the Solid State Timer upon the release of any of the seven key CYBERTYPE interface switches. The Solid State Timer in turn disables the Solid State Switch for a preset timing interval. While so disabled, the Solid State Switch interrupts the circuit over line 7L1 between the Solid State Switch and the seven key interface, thus electrically rendering the switches SW1–SW7 inoperative. After the timing interval has been completed, the Solid State Switch is enabled, completing the circuit between the controller and the interface.

With AC power applied to the unit and no interface switches closed, the controller and the delay circuit will assume their static states. In the static state the output of the Common Input Buffer Circuit over line 7L101 will be low or near ground potential. The output of the differentiator which is the input to the Solid State Timer is held at the +VDC level by resistor 7R1. With its input held high, the output of the Solid State Timer is approximately 0 volts. With the output of the Solid State Timer low, no current flows into the Timing Interval Indicator light emitting diode 7LED1 and its series connected current limiting resistor 7R11. Thus, there is no light emission from the indicator. Further, with the output of the Solid State Timer low, transistor 7Q1 will be biased off thereby providing the +VDC, via resistor 7R2 and line 7L1 to the seven key interface. With the +VDC level thus available, the switches are enabled to provide the required input signals to the CYBERTYPE controller.

The activation of any of the seven key interface switches causes the controller signal over the line 7L101 to change from approximately ground potential to the +VDC level. This level change produces a positive spike at the output of the differentiator which is also the input of the Solid State Timer. This input waveform has no effect on the timer and hence no effect on the Timing Interval Indicator or the Solid State Switch.

When the actuated switch or transducer of the seven key interface is released, the signal over line 7L101 falls to approximately 0 volts. When this occurs the output of the Differentiator is a negative-going voltage spike which is applied to the input to the Solid State Timer thus initiating its timing cycle. As previously described, the duration of this time interval is determined by the RC network including elements such as R8, R9 and C4 in the Solid State Timer circuit in FIG. 1. Again, the variable resistance R9 allows the period of the delayed timing cycle to be preset over a broad range from 0 to five or more. During the timing cycle the output of the Solid State Timer remains at approximately the +VDC level. This high voltage output results in current flow through the light emitting diode, illuminating the Timing Interval Indicator. It also provides base current to transistor 7Q1 through resistor 7R1 thereby causing the transistor to conduct heavily. While thus conducting, the output to line 7L1 which is taken directly from the collector, is held to near 0 volts. Hence, during the timing interval the switches of the interface by being deprived of the +VDC level, are effectively rendered inoperative. At the end of the timing interval the output of the Solid State Timer will again return to approximately 0 volts. The Timing Interval Indicator 7LED1 will be extinguished, and the Solid State Switch will be enabled. Both the CYBERTYPE Controller and the seven key interface delay circuit will be in their static states again prepared for any ensuing interface switch actuation as before.

49 KEY INTERFACE AND DELAY UNIT

Figure 5:
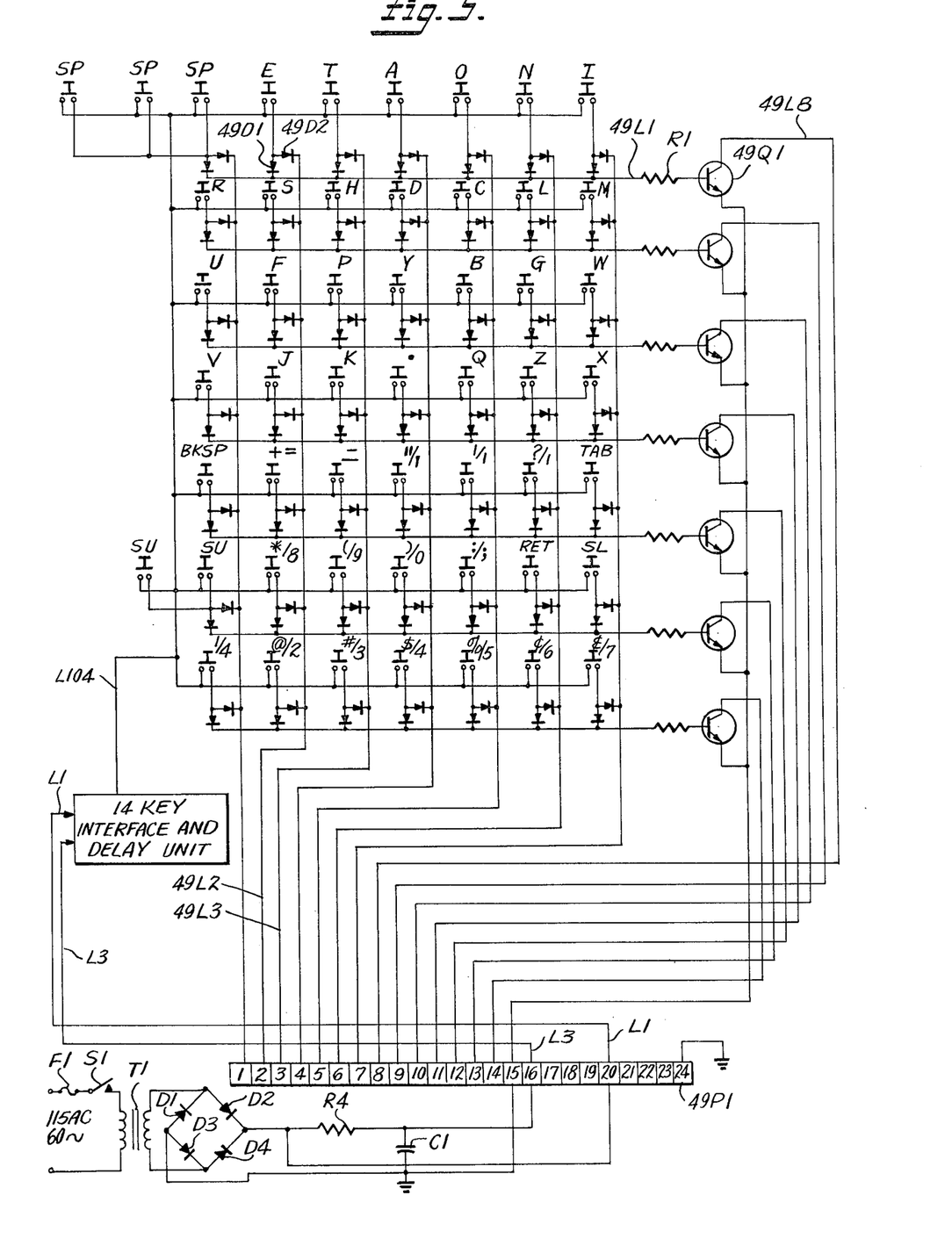
FIG. 5 is a schematic of a 49 key unit.

FIG. 5 shows a further embodiment of the variable delay feature as applied to the 49 Key Interface Unit wherein the keys are arranged in the conventional typewriter keyboard manner.

On actuation of any of the character select keys, the selected character solenoid is actuated and as before this is reflected as a current flow in power supply resistor R4 for the duration of the actuation. In a manner identical to that as described in the 14 key embodiment, the Solenoid Current Sensing means causes interruption of the power supply rectified voltage via line L104. With the supply voltage thus removed, further character key actuations are precluded for the duration of the preset delay interval.

Specifically, the AC power is applied to the input of power supply transformer T1 and at this time none of the 49 keys of the interface unit have been operated. The CYBERTYPE Power Supply and the 14 Key Interface and Delay Unit reach their static states very quickly, and thereafter there is no further current flow in resistor R4. At this point reference should be made to FIG. 1, showing the 14 key circuitry, as well as FIG. 5 for a clear understanding of the following description. The pertinent interconnections for the 49 Key Interface are the aforementioned PINS 15, 16 and 20, in addition to line L104. Also, a connector 49P1 shows a plurality of 24 PINS including PINS 1–7 inclusive which correspond to the outputs of the switches of BANK A of FIG. 1; and PINS 8–14 inclusive correspond to the switches of BANK B.

The actuation of a single character key will be discussed to illustrate a typical print cycle including the delay feature. Actuation of an input interface key "E" connects one of its fixed contacts to the positive side of the Power supply via line L104; the other of its fixed contacts is connected to the anodes of a plurality of diodes 49D1 and 49D2. The cathode of diode 49D2 is connected to one side of a key operating solenoid, as for example one contained in an undercarriage of a typewriter, via line 49L2 and PIN 2. The cathode of diode 49D1 is connected to the base of a resistor 49R1 via a line 49L1. The resistor is further connected to the base of a transistor 49Q1, whose emitter is connected to PIN 15, the aforementioned power supply common. The collector of transistor 49Q1 is connected to PIN 8 via a line 49L8. As previously described, PIN 2 and PIN 8 are connected so as to select a unique one of the print solenoids CL1–CL*n* which have been shown in a representative manner in FIG. 1.

Actuation of the E key connects the anodes of diodes 49D1 and 49D2 to the positive supply voltage. This in turn will cause actuation of the pertinent key solenoid via PINS 2 and 8 as follows: Diode 49D2, with its anode positively supplied, provides a path for solenoid current via PIN 2. Diode 49D1 allows base current to flow in transistor 49Q1 via resistor 49R1, thereby permitting heavy conduction from its emitter (PIN 15) to its collector (PIN 8) and thus provides the return path for current flow as required for solenoid actuation. In a similar manner, each of the remaining 48 solenoids may be actuated upon operation of its related key and via its unique dual seven-line matrix selection paths. For instance, operation of the "T" key will cause actuation of its related solenoid via a line 49L3 and PIN 3, in addition to the aforedescribed current return path provided by transistor 49Q1 and line 49L8 to PIN 8. Obviously, the appropriate diodes are also required. They are not mentioned here by specific designators for simplification. It will be understood that the use of the plurality of diodes shown in FIG. 5 as being connected in clusters of two (one cathode to a particular column and the other cathode to a particular row) is the conventional implementation for assuring that voltage isolation of multiple switches is achieved.

With a particular character solenoid thus energized as described above, the current flow through the solenoid also flows through resistor R4 in the power supply. The potential across resistor R4 is available via PIN 20 and a line L1, and via PIN 16 and a line L3. The difference in potential across R4 due to the current flow is sensed in the Solenoid Current Sensor portion of the circuitry contained in the 14 Key Interface block.

Within this block is contained the identical circuits from FIG. 1, namely, the Voltage Regulator, the Solenoid Current Sensor, the Solid State Timer, the Differentiator, the Timing Interval Indicator and the Solid State Switch. Thus, the identical circuit operations are obtained. Upon release of the actuated input key, a negative-going spike from the Differentiator initiates a time delay in the Solid State Variable Delay Timer which disables the Solid State Switch for the duration of the time delay. Thus, the voltage required by the 49 input keys is removed from a line L104 and they are rendered inoperative for the said duration.

It should be noted, that, as with the previously described interface units, the switch inhibiting action commences immediately upon first opening (deactuation) of a manually selected input key or switch. Thus, as a common feature of all of the Key Interface and Delay Units described above, one and only one key actuation is permitted between the presettable delay intervals.

SINGLE INPUT WHISPER-TYPE INTERFACE AND DELAY UNIT

Figure 6:
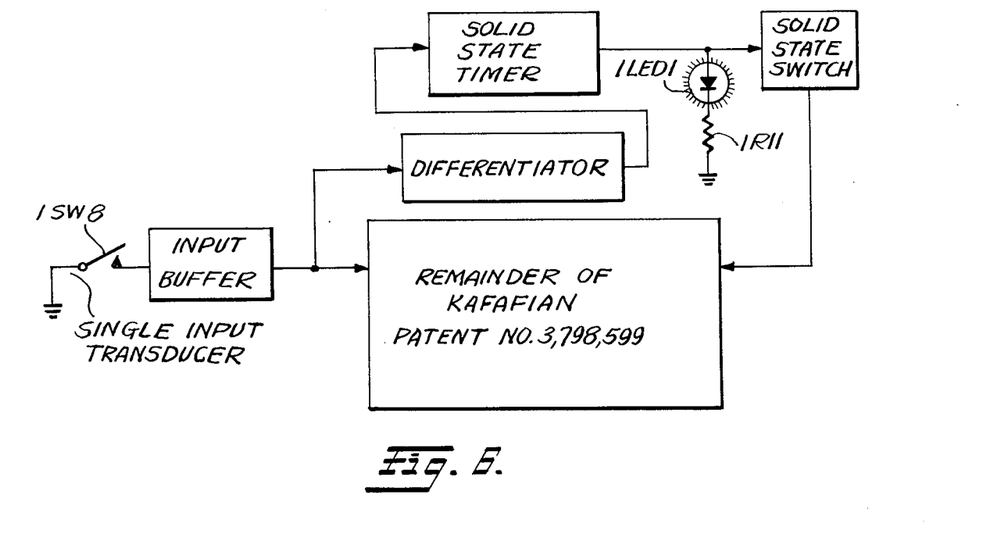
FIGS. 6 and 7 are block diagrams of a single input unit wherein the switch is Solid State and electromechanical, respectively.

Reference is now made to FIG. 6 which illustrates the circuit previously discussed in connection with a single input controller illustrated in my prior U.S. Pat. No. 3,798,599 (incorporated herein by reference). The single input interface transducer or switching means is shown in the form of a single pole, single throw, normally open switch 1SW8 connected from ground to an input buffer circuit. However, other types of transducers such as referred to in said patent may be used. The input buffer circuit is connected to the remainder of the circuitry illustrated in my prior U.S. Pat. No. 3,798,599. The timing delay circuitry is similar to that illustrated above and includes a Differentiator connected between the Input Buffer and the remainder of the patent circuit which in turn connects to the Solid State Variable Delay Timer in the manner discussed relative to the previous species. The output of the Solid State Variable Delay Timer is connected to the Time Interval Indicator LED and the Solid State Switch (Type "B"). The output of the switch in turn is connected to the Input Buffer circuit to disable the actuating signal for the duration of the preset timing delay interval. In the event that the interface transducer is inadvertently actuated a plurality of times prior to the remaining actuations as required in my U.S. Pat. No. 3,798,599, the redundant actuations are effectively blocked for the delay interval.

In the single key embodiment of the present invention, a single input transducer provides the only signaling input required from an operator. As shown in FIG. 6, a single-pole, single throw, normally open switch 1SW8 is shown as having a movable contact connected to circuit common and a fixed contact connected to an Input Buffer. Upon the first opening of the input switch the negative-going spike from the Differentiator initiates action of the Solid State Variable Delay Timer as described previously. The two results, also as described above, are: the LED is illuminated and the Solid State Switch output goes to 0 VDC. The low voltage level from the Solid State Switch is applied as an additional input to the Input Buffer which inhibits further actuations of the input switch from actuating the CYBER-TYPE and/or WHISPER-TYPE for the duration of the preset delay interval.

Figure 7:
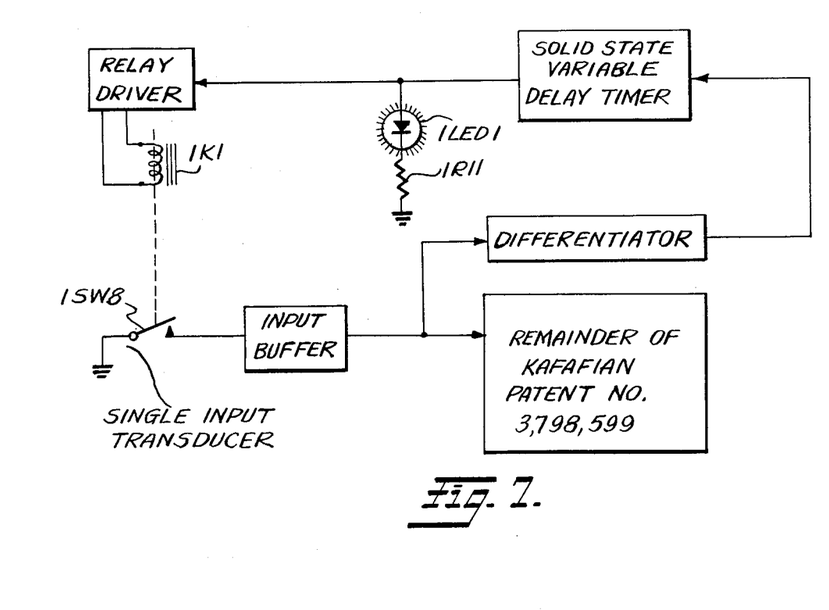

An alternate embodiment of the single input transducer may be achieved as shown in FIG. 7. In this alternative arrangement an electromechanical means is used to inhibit multiple or superfluous key actuations. In a manner similar to that described above, the first opening of the input switch causes a solenoid 1K1 to lock the interface thereby rendering impervious further switch actuation for the duration of the preset delay interval and providing feedback in the form of a force prohibitive to actuation by the user.

As will be noted in FIG. 1, a conventional audible or palpable indication means can be used in place of or in conjunction with the visual indicator in each embodiment, depending upon the requirements of the user.

The dual-input referred to above involves the establishment for every function or letter in a multiplicity of functions, for example, the alphabet, a unique combination of designators. The following is a chart of my dual-input Cyber-code which correlates the combination of designators with the typewriter function:

While one embodiment of the invention has been described, it will be understood that it is capable of many further modifications and this application is intended to cover any variations, uses or adaptations of the invention following in general, the principles of the invention and including such departures from the present disclosure as come within knowledge or customary practice in the art to which the invention pertains, and as may be applied to the essential features hereinbefore set forth and fall within the scope of the invention or the limits of the appended claims.

I claim:
1. A method of communication and/or control for persons who are handicapped including reducing the probability of error due to insufficient motor control, muscular incoordination spasticity and the like, comprising:
   a. establishing for every function in a multiplicity of functions a unique combination of designators;
   b. generating a pair of complete man-machine language output signals representative of two of said unique designators;
   c. providing at least one actuatable interface means for selectively generating said output signals upon at least a dual actuation of said input interface means;
   d. connecting utilization means to the pair of output signals for producing a function commensurate with actuation of said input interface means,
   e. disabling said producing means for a time delay interval which may be selectively varied whereby said producing means is rendered impervious to subsequent actuations of said input interface means prior to expiration of the time delay so that spastic or other extraneous movements by the handicapped operator causing inadvertent actuations of said input interface means do not produce undesired functions.

2. A method as defined in claim 1 including indicating the expiration of the time delay.

3. A method as defined in claim 1 including varying the time delay for a plurality of seconds.

* * * * *